United States Patent
Yang et al.

(10) Patent No.: US 7,295,414 B2
(45) Date of Patent: Nov. 13, 2007

(54) POWER OUTPUT DEVICE WITH PROTECTION FUNCTION FOR SHORT CIRCUIT AND OVERLOAD

(75) Inventors: Cheng-Chung Yang, Tainan (TW); Da-Huei Lee, Tainan (TW); Tai-Haur Kuo, Tainan (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 11/456,093

(22) Filed: Jul. 7, 2006

(65) Prior Publication Data
US 2007/0007912 A1 Jan. 11, 2007

(30) Foreign Application Priority Data
Jul. 8, 2005 (TW) .............................. 94123192 A (51) Int. Cl.
*H02H 9/08* (2006.01)
(52) U.S. Cl. ...................................... 361/93.9
(58) Field of Classification Search ............... 361/93.9, 361/93.1, 88, 91.1, 90
See application file for complete search history.

(56) References Cited

U.S. PATENT DOCUMENTS
6,452,766 B1 * 9/2002 Carper ........................ 361/18

* cited by examiner

*Primary Examiner*—Shawn Riley
(74) *Attorney, Agent, or Firm*—Jianq Chyun IP Office (57) ABSTRACT

A power output device includes a bridged output stage, a reference voltage generator and a detecting unit to compare the output voltages from the aforementioned two units. The bridged output stage may be implemented by a full-bridge or a half-bridge configuration. The reference voltage generator is symmetric to the bridged output stage to generate a reference voltage, which is served as a reference voltage range for the voltage difference of the two terminals of the turned-on transistors in the bridged output stage during operation. When the detecting unit detects the voltages across the two terminals of the turned-on transistors in the bridged output stage exceed the reference voltage range, all the transistors are turned off and no power is outputted to the load. Therefore, the circuit is capable of preventing damages caused by a large current due to overload or short circuit.

15 Claims, 5 Drawing Sheets

POWER OUTPUT DEVICE WITH PROTECTION FUNCTION FOR SHORT CIRCUIT AND OVERLOAD

CROSS-REFERENCE TO RELATED APPLICATION

This application claims the priority benefit of Taiwan application Ser. No. 94123192, filed on Jul. 8, 2005. All disclosure of the Taiwan application is incorporated herein by reference.

BACKGROUND OF THE INVENTION

1. Field of Invention

The present invention relates to a power output device, and more particularly, to a power output device with protection function for short circuit and overload.

2. Description of the Related Art

A conventional power output device usually uses a transistor or a plurality of transistors to form a bridged output stage for amplifying a signal and outputting the amplified signal to a load. An inadvertent operation, however, may cause an abnormally large current flowing through the transistors and thus damaging the transistors. For example, load is in short circuit, and the output terminal is short to ground or to a voltage source, all such foregoing conditions may easily damage the whole circuit and cause danger. For the reason to prevent the power output device being out of order due to the aforementioned abnormal operation, and thereby improve reliability of circuit, a protection circuit for short circuit and overload is designed to protect the power output device.

Figure 1:
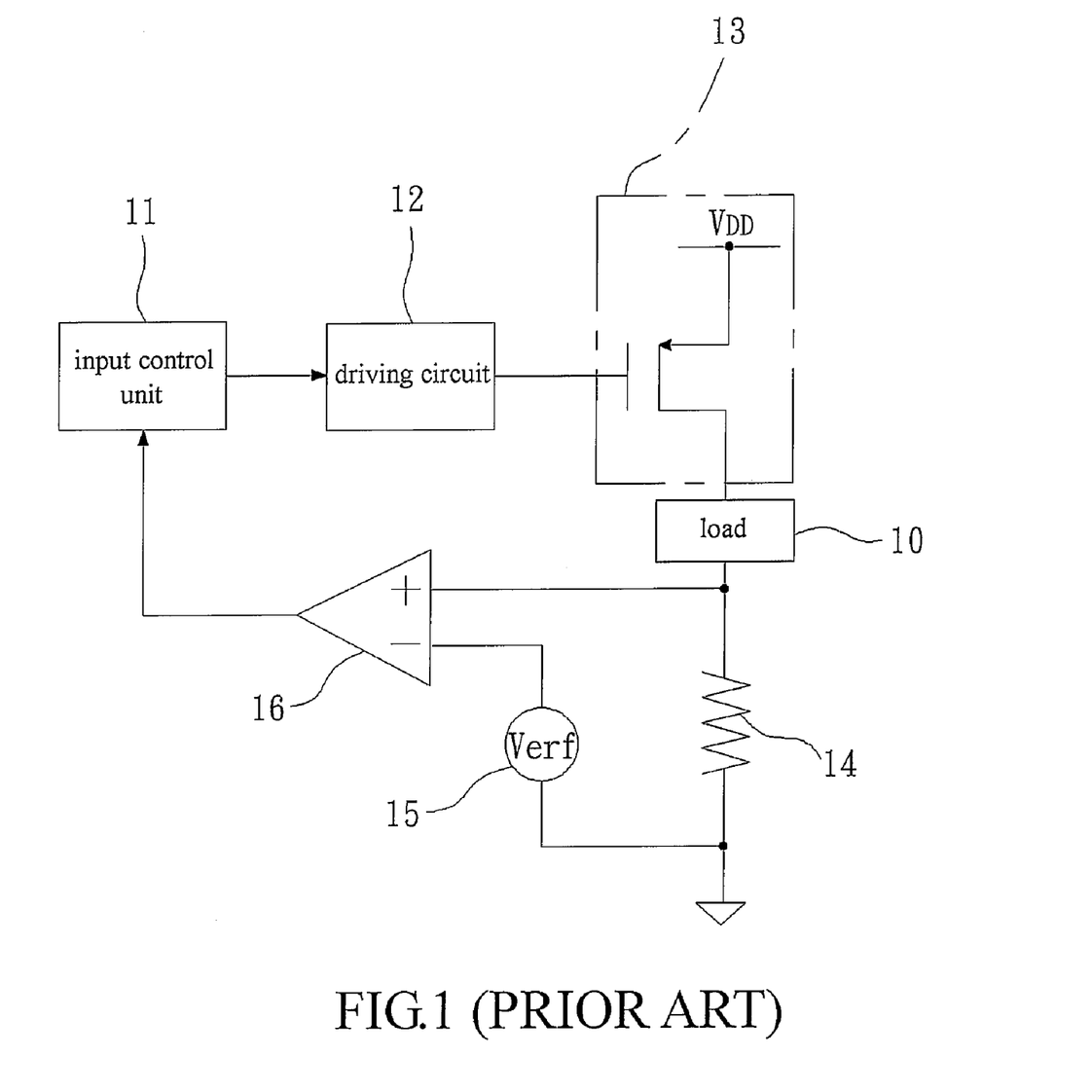
FIG. 1 is a conventional power output device with a function of preventing short-circuit and overload.

FIG. 1 is a conventional power output device with a protection circuit for short circuit and overload. Referring to FIG. 1, the power output device comprises an input control unit 11 for receiving a signal, a driving circuit 12 for receiving the output signal from the input control unit 11, a power output unit 13 driven by the driving circuit 12 for outputting an amplified signal to a load 10, a resistor 14 connected in series with the load 10, a reference voltage source 15 and a comparator 16. The power output unit 13 can be constructed by a transistor. The output current from the transistor flows through the load 10 and the resistor 14, on which a voltage is generated between two terminals of the resistor 14. The generated voltage drop is inputted into a positive input terminal of the comparator 16, while the negative input terminal of the comparator 16 is connected to the reference voltage source 15. Thus, the output current from the transistor is converted into a voltage signal. Through comparing the voltage signal with the output voltage of the reference voltage source 15, if short circuit or overload occurs, an abnormal large current can be detected.

If the output current is normal (that is, the output current is within a normal range), the voltage of the resistor 14 is less than a reference voltage value outputted by the reference voltage source 15. At this moment, the output voltage of the comparator 16 is in a low level, and the input control unit 11 controls the transistor to normally operate and provide current to the load. If the output current is abnormally large due to short circuit or overload, the voltage of the resistor 14 becomes larger than a reference voltage value. The output voltage of the comparator 16 immediately rises to a high level, so as to drive the input control unit 11 to turn off the transistor via the driving circuit 12. Thereby, it can prevent the transistor from burning out by an over current.

However, although the aforementioned protection mechanism can achieve the object of protecting the output power device, it requires an element (such as the resistor 14 connected in series with the load 10) to provide a voltage for detecting. The resistor 14 consumes a certain power, it introduces lower power efficiency and reduces output power. Moreover, if the resistor 14 is integrated into an IC, the issue of thermal dissipation in IC package should be considered due to the resistor 14 generates additional heat.

SUMMARY OF THE INVENTION

Accordingly, an object of the present invention is to provide a power output device with substantially no influence on an output power and a power conversion efficiency thereof, for precisely preventing short-circuit and overload.

The power output device with a protection function for short circuit and overload of the present invention is suitable for outputting an amplified voltage signal to a load. The power output device of the present invention includes a bridged output stage for outputting an amplified signal, a reference voltage generator unit for outputting a reference voltage range and a detecting unit for comparing the output voltages from the aforementioned two units.

The bridged output stage has one transistor set or a pair of transistor sets, wherein the transistor set has two transistors connected in series between a power source and a ground and outputs an amplified voltage signal to the load.

The reference voltage generator includes at least a reference circuit, which has at least a reference transistor and a reference resistor connected in series with the reference transistor. Wherein, the size of the reference transistor is proportional to that of the transistor implemented in the bridged output stage, and this proportional relation is the same as that between the reference resistor and the setting value of the minimum allowable load value. That is to say, the reference circuit is symmetrical to the bridged output stage, so that a reference voltage range is generated based on the symmetry design scheme.

The detecting unit receives voltage difference across the two terminals of each of the transistor in the bridged output stage when it is turned on, and the voltage difference is compared with the reference voltage range produced by the reference voltage generator. When the voltage difference across two terminals of all turned-on transistors in the bridged output stage exceeds the reference voltage range generated by the reference voltage generator, the detecting unit immediately turns all the transistors in the bridged output stage off such that no signal is outputted to the load.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

It is noted that, for simplicity and easily understanding the context, all the similar parts are labeled in the same number.

Figure 2:
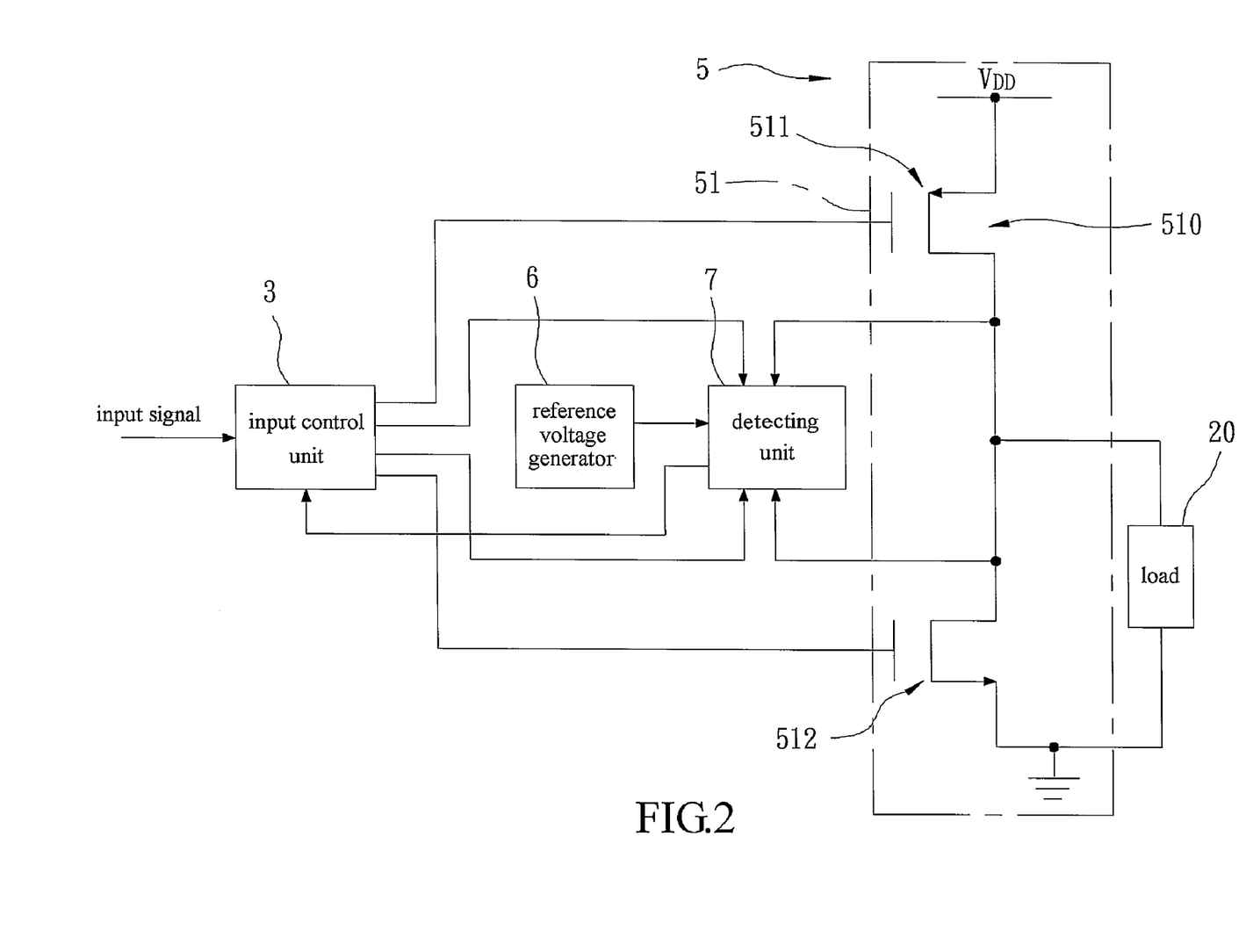
FIG. 2 is a block diagram, schematically showing a power output device with a function of preventing short-circuit and overload, according to the first embodiment of the present invention.
Figure 3:
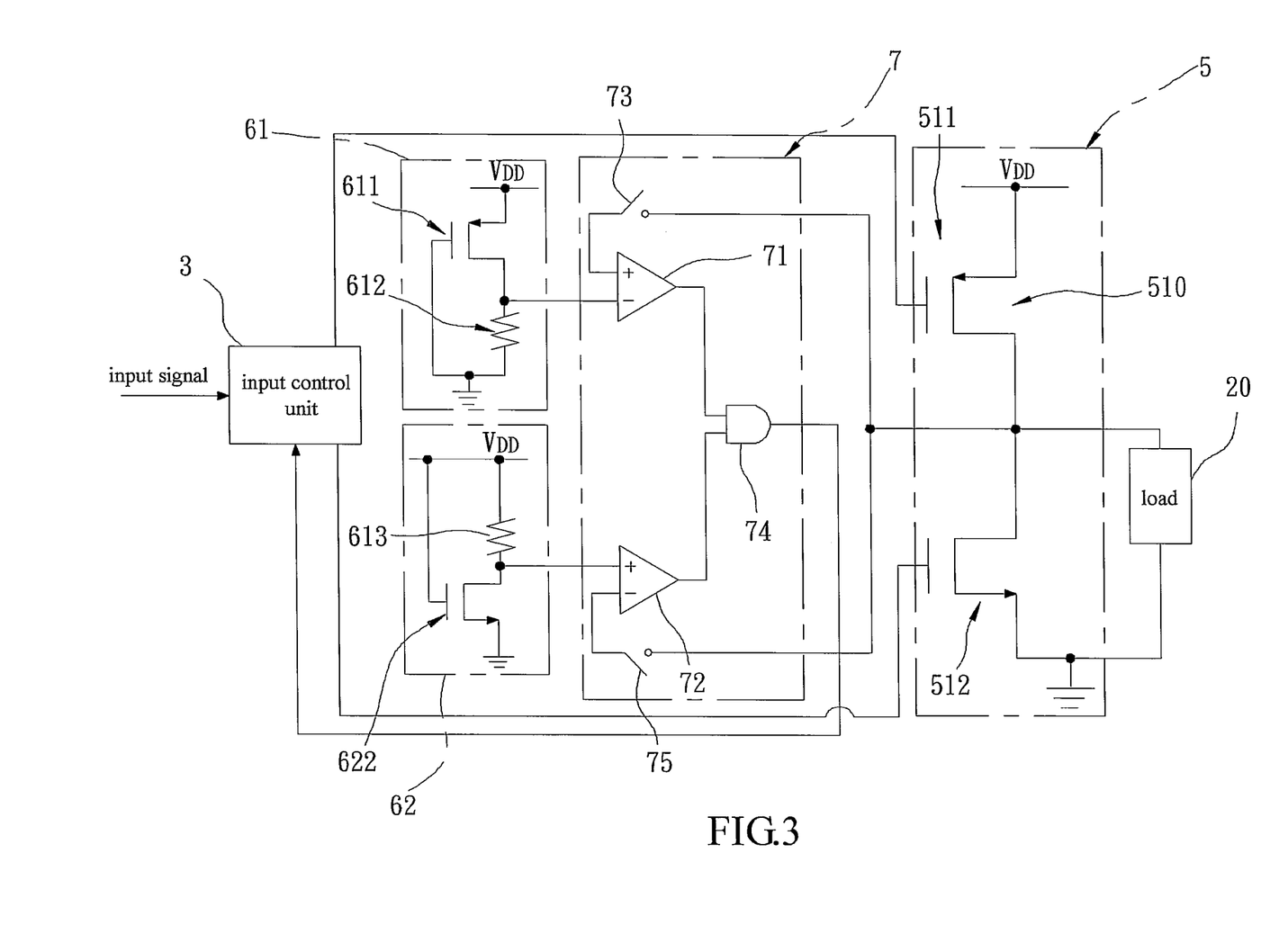
FIG. 3 is a schematic circuit diagram, schematically showing a power output device with a function of preventing short-circuit and overload, according to the first embodiment of the present invention.

FIG. 2 is a block diagram of a power output device with a protection function for short circuit and overload according to the first embodiment of the present invention, and FIG. 3 is a circuit diagram showing a power output device with the protection function for short circuit and overload according to the first embodiment of the present invention. Referring to FIG. 2 and FIG. 3, the power output device provides an amplified signal to a load 20. The power output device of the present invention includes an input control unit 3 to receive an external input signal; a bridged output stage 5 driven by the input control unit 3 for outputting the amplified signal to the load 20; a reference voltage generator 6 for providing a reference voltage range and a detecting unit 7 for comparing the output voltage from the bridged output stage 5 with the reference voltage from the reference voltage generator unit 6.

After the input control unit 3 processes the external input signal, outputting a processed signal to control the bridged output stage 5 for producing an amplified output signal. Because the input control unit 3 herein is a conventional electrical component usually seen in a power amplifier, its description is not further described.

The bridged output stage 5 has a transistor set 51 that includes two transistors 510 connected between a power supply and ground, and the connection node of the transistors 510 outputs the amplified signal to the load 20. In the embodiment, the bridged output stage 5 is a half-bridge power output amplifier, the transistors 510 comprises a P-type transistor 511 and an N-type transistor 512 connected in series. One terminal of the load 20 is electrically connected to the connection node of the transistors 510, while the other terminal thereof is grounded. The transistors in the embodiment are metal oxide semiconductor field effect transistors (MOSFETs). In other words, the drain of the P-type transistor 511 is electrically connected to the drain of the N-type transistor 512. The gates of the P-type transistor 511 and the N-type transistor 512 respectively receive the output signals from the input control unit 3 to control the transistors 510 being turned on or off. The bridged output stage 5 herein is a conventional electrical amplification circuit, and its further descriptions are omitted. In addition, the embodiment of the present invention not limits the configuration of the aforementioned circuit and the types of the aforementioned transistors 510.

The reference voltage generator 6 has two reference circuits, i.e. a P-type reference circuit 61 and a N-type reference circuit 62, wherein the P-type reference circuit 61 comprises a P-type reference transistor 611 and a reference resistor 612 connected in series between a power supply and the ground. The N-type reference circuit 62 comprises a reference resistor 613 and an N-type reference transistor 622 connected in series between the power supply and the ground. The resistance of the reference resistors 612 and 613 is proportional to that of the load 20, and the sizes of the P-type reference transistor 611 and the N-type reference transistor 622 are proportional to those of the transistors 511 and 512 with the same proportional ratio as that between the resistance of the reference resistors 612, 613 and the load 20. Moreover, all the transistors have the same voltage $V_{GS}$. Thus, reference transistor 611, 622 are in a symmetrical configuration with respect to the transistors 511, 512 but with smaller sizes to reduce power consumption. Due to the same current density for all the transistors 611, 612, 511 and 512, a specific reference voltage range is generated, i.e., a voltage difference across the turned-on transistors 511 and 512 during the normal operation.

The detecting unit 7 comprises two comparators 71 and 72; two switches 73 and 75; and a logic gate 74, wherein both the comparators 71 and 72 have a positive input terminal, a negative input terminal and an output terminal. The positive input terminal of the first comparator 71 and the negative input terminal of the second comparator 72 are electrically connected to the switches 73 and 75, respectively, and also electrically connected to the drains of the P-type transistor 511 and the N-type transistor 512 of the bridged output stage 5 via the two switches. The negative input terminal of the first comparator 71 is electrically connected to the drain of the P-type reference transistor 611 in the P-type reference circuit 61 for receiving the generated reference voltage. The positive input terminal of the second comparator 72 is electrically connected to the drain of the N-type reference transistor 622 in the N-type reference circuit 62 for receiving the generated reference voltage. The output terminals of the first comparator 71 and the second comparator 72 are electrically connected to the two input terminals of the logic gate 74, respectively. The logic gate 74 is an AND gate. The comparators 71 and 72; the switches 73 and 75; and the logic gate 74 herein are conventional electronic components, the further descriptions about these known components are omitted.

Figure 4:
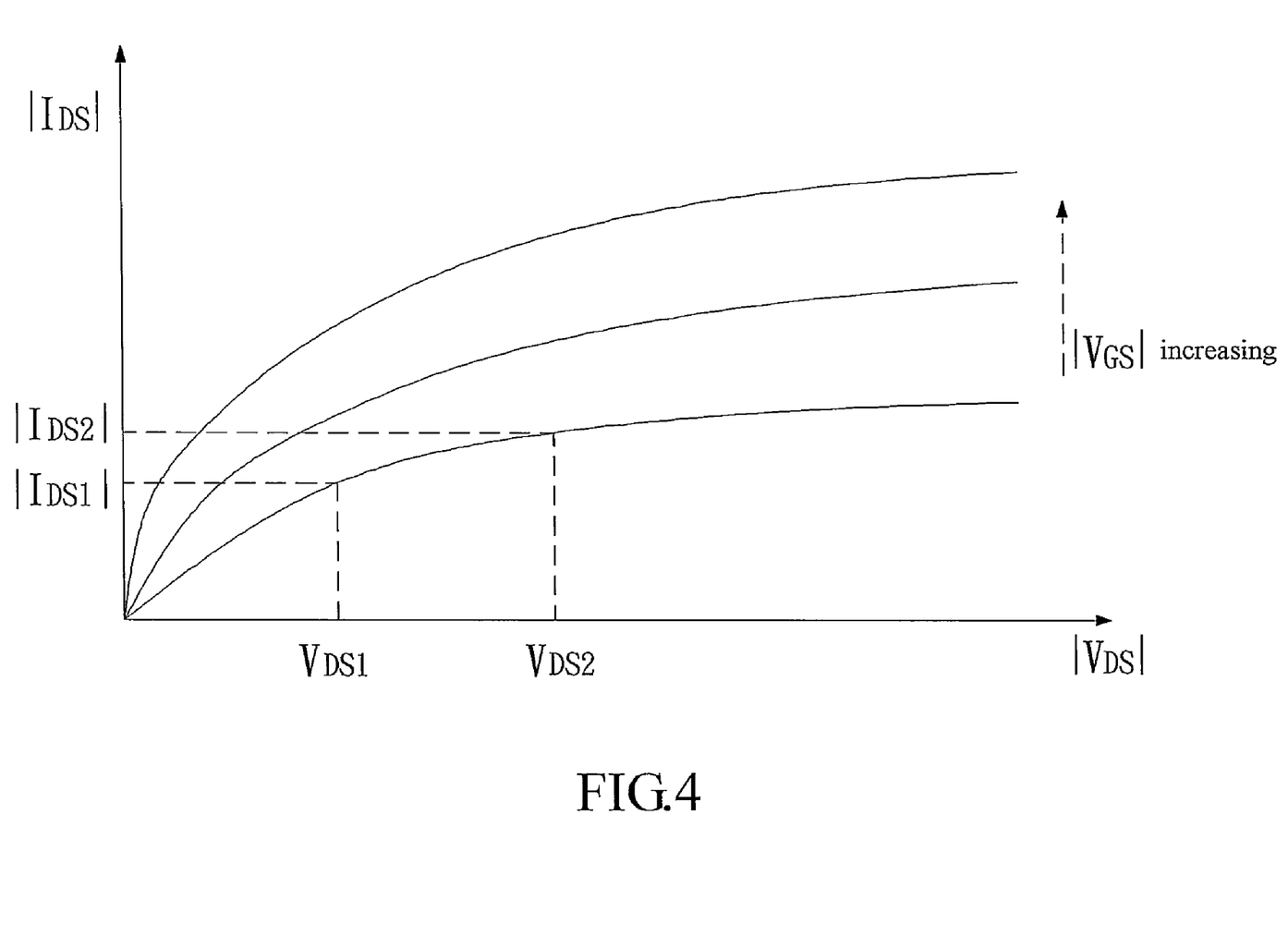
FIG. 4 is a relationship curve diagram between the source-drain voltage $V_{DS}$ and the source-drain current $I_{DS}$ in a MOSFET.

FIG. 4 is a relationship curve between the source-drain voltage $V_{DS}$ and the source-drain current $I_{DS}$ in a MOSFET. As a transistor is turned on, a source-drain current $I_{DS}$ flows through the drain and the source thereof and a voltage drop $V_{DS}$ between the source and the drain thereof is generated, for example, a voltage drop $V_{DS1}$ is generated in response to current $I_{DS1}$, while a voltage drop $V_{DS2}$ is generated in response to current $I_{DS2}$. As the transistor is in a linear region, the source-drain current $I_{DS}$ is roughly proportional to the source-drain voltage $V_{DS}$, thereby the voltage $V_{DS}$ will suddenly rise due to the surging current $I_{DS}$ which is resulted from a short-circuit load or an over-current condition. The present invention takes advantage of the $I_{DS}$-$V_{DS}$ relationship and detects the variation of the voltage $V_{DS}$ to decide whether the load is short circuited or overloaded, so as to prevent the load or the transistor from damage. For the P-type transistor 511 of the bridged output stage 5, its voltage $V_{DS}$ can be derived from the drain voltage and the input voltage thereof, while for the N-type transistor 512, its voltage $V_{DS}$ can be derived from the drain voltage and the ground voltage thereof. Similarly, for the reference voltage generator 6, the reference voltages of the reference circuits 61 and 62 are the drain voltages of the P-type reference transistor 611 and the drain voltage of the N-type reference transistor 622 respectively.

During normal operation, if the P-type transistor 511 of the bridged output stage 5 is turned on, because the current flows through the P-type transistor 511 to drive the load 20, the drain voltage of the P-type transistor 511 is larger than the reference voltage of the P-type reference circuit 61. On the other hand, as the N-type transistor 512 is turned on, the current flows from the load 20 to the N-type transistor 512, and then to the ground. Similarly, the drain voltage of the N-type transistor 512 is smaller than the reference voltage of the N-type reference circuit 62. The switches 73 and 75, according to the on/off state of the P-type transistor or the N-type transistor, allow the comparator 71 or 72 to detect the drain voltage of the on-state P-type transistor or the drain voltage of the on-state N-type transistor, respectively. As the switch 73 or 75 is turned off, the corresponding connected comparator is reset. Under the normal operation, both outputs of the first comparator 71 and the second comparator 72 are high-level voltages, and the output logic of the logic gate 74 is at high level too.

As one terminal of the load 20 is short to the power source, the drain voltage of the N-type transistor 512 in the bridged output stage 5 is abnormally increased to a level larger than the reference voltage generated by the reference circuit 62, so the voltage at the negative input terminal of the second comparator 72 is larger than the positive input terminal thereof. Sequentially, the output terminal of the second comparator 72 is changed from the high-level voltage to 0V, and then makes the output of the logic gate 74 drop to low. Thereby, the input control unit 3 is driven to turn off all the transistors in the bridged output stage 5. Thus, the power is ceased to be outputted to the load 20. Similarly, as one terminal of the load 20 is short to the ground, the drain voltage of the P-type transistor 511 in the bridged output stage 5 is pulled down to a voltage less than the reference voltage generated by the P-type reference circuit 61. Thus, the output of the first comparator 71 is changed from the high-level voltage to 0V, which makes the output of the logic gate 74 drop to low to turn off all transistors of the output stage 5. Hence, the power is ceased to be outputted to the load 20. As the load 20 is excessive small, it causes the output current being over-current. The phenomena can be detected by both the first comparator 71 and the second comparator 72. Once the drain voltage of either the transistor 511 or 512 exceeds the reference voltage range from by the reference circuit 61 and 62, the logic gate 74 immediately outputs a low-level voltage to close all the transistors in the bridged output stage 5.

Figure 5:
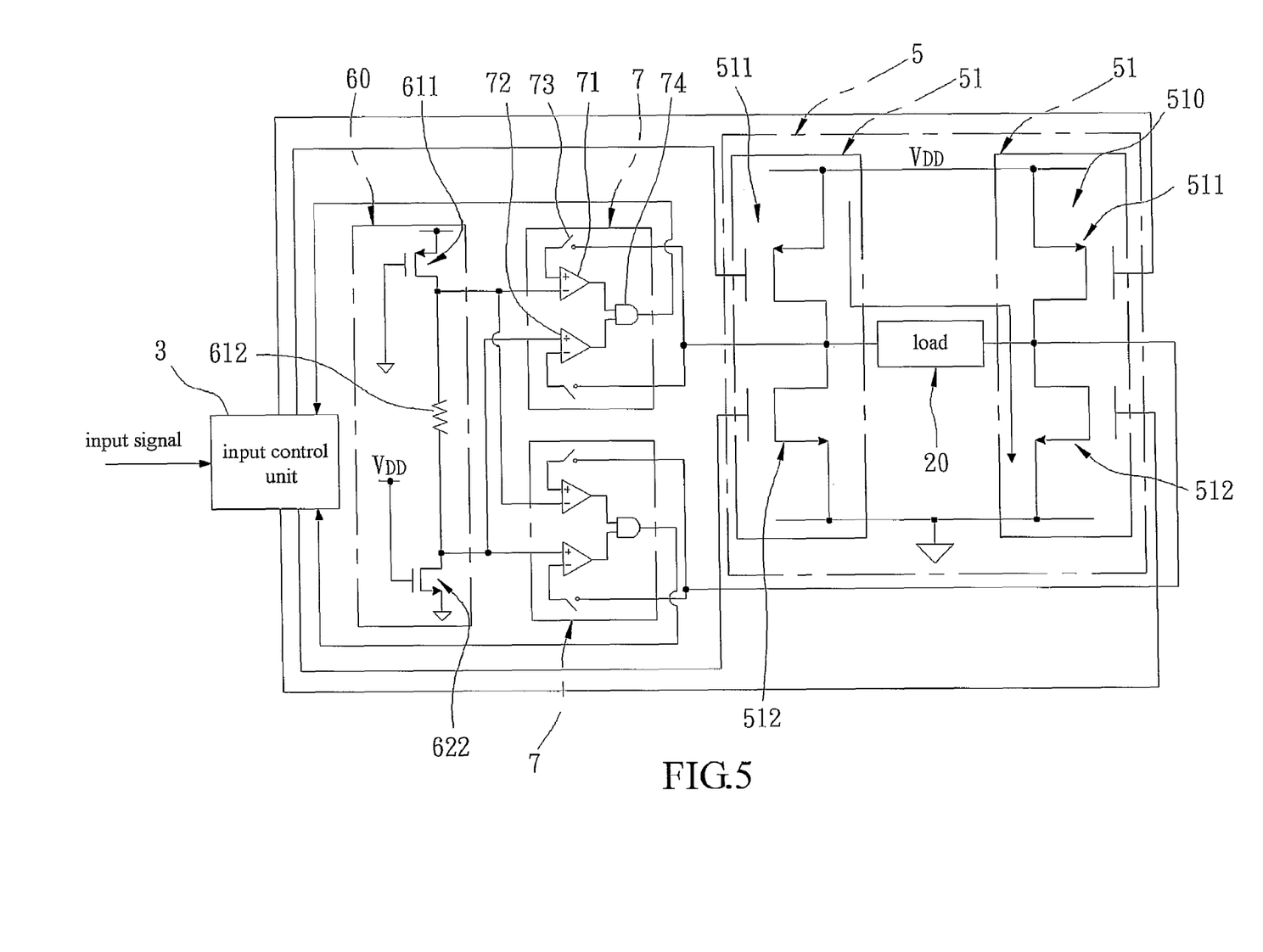
FIG. 5 is a schematic circuit diagram, schematically showing a power output device with a function of preventing short-circuit and overload, according to the second embodiment of the present invention.

FIG. 5 is a circuit diagram schematically showing a power output device with the protection function for short circuit and overload according to the second embodiment of the present invention. Referring to FIG. 5, the second embodiment of the present invention is similar to the first embodiment except that the bridged output stage 5 in the second embodiment is a full-bridge power output, i.e. the power output stage 5 has two transistor sets 51 connected in parallel. The structure of the transistor set 51 is the same as the one (transistor set 51) of the first embodiment. In addition, the reference voltage generator 6 has only one reference circuit 60, which comprises a P-type reference transistor 611, a reference resistor 612 and a N-type reference transistor 622 sequentially connected in cascade between the power source and ground. The two terminals of the load 20 are electrically connected between the drains of the transistors of the two transistor sets 51, respectively. The sizes of the P-type reference transistor 611 and the N-type reference transistor 622 are proportional to those of the transistors 511 and 512 with the same proportional ratio as that between the reference resistor 612 and the minimum allowable value of the load 20. Besides, in the second embodiment, there are two detecting units 7 for detecting and comparing the transistor sets 51, respectively.

As the bridged output stage 5 normally operates, the P-type transistor 511 of a transistor set 51 and the N-type transistor 512 of the other transistor set 51 are turned on and the current flows from the P-type transistor 511 of the transistor set 51, via the load 20, to the N-type transistor 512 of the other transistor set 51 for providing current to the load 20. This is a conventional operation manner of a general bridged output stage, and is not further described.

In the reference circuit 60 of the reference voltage generator 6, the P-type reference transistor 611 and the N-type reference transistor 622 are turned on with the same voltage $V_{GS}$ of the transistors in the output stage 5, the current sequentially flows through the P-type reference transistor 611, the reference resistor 612 and the N-type reference transistor 622. The current flowing path is similar to the current flowing path in the bridged output stage 5, so as to obtain the drain-source voltage ranges of the P-type transistor 511 and the N-type transistor 512 under a normal operation. The two comparators 71 and 72 in the detecting unit 7 compare the drain voltages of the reference transistors 611 and 622 with the drain voltages of the transistors 511 and 512. In practical operation of the bridged output stage 5, if it occurs that the load 20 is short to the voltage source or ground, or the load 20 is excessive small (that is, over current passes through the load 20 and the transistors 511 or 512), causing the drain voltages of the transistors 511 and 512 to be abnormally pulled down or up, the detecting unit 7 is able to immediately drive the input control unit 3 to turn off all the transistors 510 for preventing the bridged output stage 5 and the load 20 from damage caused by the large current.

In summary, the power output device with overload protection function of the present invention utilizes the comparison between the drain voltages of the reference transistors 611 and 622 in the reference voltage generator 6 and the drain voltages of the transistors 511 and 512 in the bridged output stage 5 with the same turn-on voltage $V_{GS}$. When the circuit is shorted to the power supply or ground, the current soars and then causes the drain voltage to be abnormally increased or decreased. Then, the detecting unit 7 can immediately drive all transistors 510 of the bridged output stage 5 to be off for preventing a circuit from damages. The sizes of the reference transistors 611 and 622 are proportional to those of the transistors 511 and 512 with the same proportion ratio as that between the resistance of the reference resistor 612 and the resistance of the load 20, so that the present invention can more precisely prevent the bridged output stage 5 from short-circuit or overload damages. In addition, the aspect ratios for the reference transistors 611 and 622 are much smaller than those of the transistors 510 in the bridged output stage 5. The power consumption of the reference voltage generator 6 is effectively reduced such that the power efficiency of the overall circuit is improved, for indeed achieving the object of the present invention.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A power output device, with a protection function for short circuit and overload, suitable for outputting an amplified voltage signal to a load, and the power output device comprising:

a bridged output stage, comprising a transistor set, wherein the transistor set comprises two transistors connected in series between a power source and a ground, and the amplified voltage signal is outputted to the load from a connection node of the two transistors;

a reference voltage generator, comprising at least a reference circuit, wherein the reference circuit comprises a reference transistor and a reference resistor connected in series, a size of the reference transistor is proportional to the transistors of the bridged output stage in a proportion factor, wherein the proportion ratio of the size of the reference transistor and the bridged output stage is the same as the proportion ratio of the resistance of the reference resistor and the load, such that a circuit configuration of the reference voltage generator is symmetrical to the bridged output stage, and a reference voltage range is accordingly generated; and a detecting unit, receiving a voltage difference across the two terminals of the turned-on transistors in the bridged output stage and comparing the received voltage difference with the reference voltage range generated by the reference voltage generator, wherein if an induced current of the load is over or the load is in short circuit, the voltage difference across the two terminals of the turned-on transistor in the bridged output stage exceeds the reference voltage range generated by the reference voltage generator, the detecting unit immediately turns off all transistors in the bridged output stage to stop outputting power to the load.

2. The power output device of claim 1, wherein the bridged output stage is a half-bridge output stage, the transistors are P-type transistor and N-type transistor, respectively, one terminal of the load is electrically connected to the connection node between the transistors, while the other terminal of the load is electrically connected to the ground and the reference voltage generator comprises a P-type reference circuit and an N-type reference circuit, wherein the P-type reference circuit is formed by a P-type reference transistor and a reference resistor connected in series between a power source and the ground, while the N-type reference circuit is formed by a reference resistor and an N-type reference transistor connected in series between the power source and the ground, so as to obtain the voltage difference from the two terminals of the P-type reference transistor and the N-type reference transistor.

3. The power output device of claim 2, wherein the detecting unit comprises a first comparator, a second comparator and a logic gate, each comparator has a positive input terminal, a negative input terminal and an output terminal, the positive input terminal of the first comparator and the negative input terminal of the second comparator are electrically connected to the output node of the bridged output stage, the negative input terminal of the first comparator receives a first reference voltage from the P-type reference circuit, the positive input terminal of the second comparator receives a second reference voltage from the N-type reference circuit, the output terminals of the first comparator and the second comparator are electrically connected to the logic gate, and the first comparator and the second comparator are used for comparing the voltage differences across the two terminals of the turned-on transistors in the bridged output stage with the voltage differences across the two terminals of the transistors in the reference voltage generator.

4. The power output device of claim 3, wherein the detecting unit further comprises two switches connected between the positive input terminal of the first comparator and the bridged output stage and between the negative input terminal of the second comparator and the bridged output stage, respectively, according to a on-off state of the P-type transistor and the N-type transistor in the bridged output stage, the detecting unit utilizes the switches to control the two comparators to detect the voltage difference across the two terminals of the P-type transistor or the N-type transistor, respectively, and if the switch is off, the comparator connected thereto is at a reset status.

5. The power output device of claim 3, further comprising an input control unit for receiving an external input signal to drive the transistors in the bridged output stage to be turned on or off, wherein the logic gate in the detecting unit is used to provide a signal for the input control unit to turn off the transistors.

6. The power output device of claim 3, wherein all the transistors in the bridged output stage and in the reference voltage generator are metal oxide semiconductor field effect transistors (MOSFETs).

7. The power output device of claim 6, wherein the drains of the P-type transistor and the N-type transistor in the bridged output stage are electrically connected each other, the drains of the P-type transistor and the N-type transistor of the reference voltage generator are electrically connected to the reference resistors respectively, the logic gate is an AND gate, the positive input terminal of the first comparator and the negative input terminal of the second comparator are, via switches, electrically connected together to the drains of the P-type transistor and the N-type transistor in the bridged output stage, the negative input terminal of the first comparator is electrically connected to the drain of the reference transistor in the P-type reference circuit, the positive input terminal of the second comparator is electrically connected to the drain of the reference transistor in the N-type reference circuit and the output terminals of the first comparator and the second comparator are electrically connected to the input terminals of the logic gate, wherein when a voltage level at the node connected between the P-type transistor and the N-type transistor in the bridged output stage is smaller than the reference voltage from the N-type reference circuit or larger than the reference voltage from the P-type reference circuit, the output terminals of the comparators outputs a high-level voltage to the two input terminals of the logic gate, the logic gate outputs a high-level voltage to the input control unit to ensure that the bridged output stage is normally operated, when the voltage level at the node connected between the P-type transistor and the N-type transistor in the bridged output stage is larger than the reference voltage from the N-type reference circuit or smaller than the reference voltage from the P-type reference circuit, one of the output terminals of the comparators outputs a low-level voltage, then the output terminal of the logic gate outputs a low-level voltage to the input control unit for turning off the transistors.

8. The power output device of claim 7, wherein aspect ratios of the P-type reference transistor and the N-type reference transistor are set to be significantly smaller than aspect ratios of the P-type transistor and the N-type transistor in the bridged output stage.

9. A power output device, with a protection function for short circuit and overload, suitable for outputting an amplified voltage signal to a load, and the power output device comprising:

a bridged output stage, comprising two transistor sets, wherein each transistor set comprises two transistors connected in series between a power source and a ground and a connection node of the two transistors outputs the amplified voltage signal to the load;

a reference voltage generator, comprising a first reference transistor, a reference resistor and a second reference transistor connected in series between the power source and the ground, wherein sizes of the reference transistors are proportional to the transistors in the bridged output stage in a same proportional ratio to that of the resistance of the reference resistor and the load, the circuit configuration of the reference voltage generator is symmetrical to the bridged output stage, and a reference voltage range is accordingly generated; and two detecting units, respectively receiving voltage differences across the two terminals of the turned-on transistors in the two transistor sets of the bridged output stage, and comparing the received voltage differences with the reference voltage range generated by the reference voltage generator, wherein if an induced current of the load is over or the load is in short circuit, the voltage differences of the turned-on transistors in the bridged output stage exceed the reference voltage range generated by the reference voltage generator, so that the detecting unit immediately turns all the transistors in the bridged output stage off and stop outputting signal to the load.

10. The power output device of claim 9, wherein the transistors of each transistor set are P-type transistors and N-type transistors, one terminal of the load is connected to a node connected between the two transistors in one of the transistor sets, while the other terminal of the load is electrically connected to a node connected between the two transistors in the other transistor set, the reference transistors are a P-type reference transistor and a N-type reference transistor so as to obtain the voltage differences from the two terminals of the P-type reference transistor and the N-type reference transistor.

11. The power output device of claim 10, wherein each detecting unit comprises a first comparator, a second comparator and a logic gate, each comparator has a positive input terminal, a negative input terminal and an output terminal, the positive input terminal of the first comparator and the negative input terminal of the second comparator are electrically connected to the output node of the bridged output stage, the negative input terminal of the first comparator is electrically connected to the node connected between the P-type reference transistor and the reference resistor, the positive input terminal of the second comparator is electrically connected to the node connected between the N-type reference transistor and the reference resistor, the output terminals of the first comparator and the second comparator are electrically connected to the input terminal of the logic gate.

12. The power output device of claim 11, wherein each detecting unit further comprises two switches respectively connected between the positive input terminal of the first comparator and a transistor set of the bridged output stage and between the negative input terminal of the second comparator and the other transistor set of the bridged output stage, according to a on-off state of the P-type transistor or the N-type transistor in the bridged output stage, the detecting unit utilizes the switches to control the two comparators to detect the voltage differences across the two terminals of the P-type transistor or the N-type transistor in the bridged output stage respectively, and if any of the switches is off, the comparator connected thereto is at a reset status.

13. The power output device of claim 11, further comprising an input control unit for receiving an external input signal to drive the transistors in the bridged output stage to be turned off, wherein the logic gate in the detecting unit is used to provide a signal from the input control unit to turn off the transistors.

14. The power output device of claim 9, wherein all the transistors in the bridged output stage and in the reference voltage generator are metal oxide semiconductor field effect transistors (MOSFETs).

15. The power output device of claim 14, wherein the drains of the P-type transistor and the N-type transistor of each transistor set in the bridged output stage are connected each other, the drain of the P-type reference transistor of the reference voltage generator is electrically connected to one terminal of the reference resistor, the other terminal of the reference resistor is electrically connected to the drain of the N-type reference transistor, the logic gate is an AND gate, the positive input terminal of the first comparator and the negative input terminal of the second comparator are, via switches, electrically connected together to the drains of the P-type transistor and the N-type transistor in the bridged output stage, the negative input terminal of the first comparator is electrically connected to the drain of the P-type reference transistor, the positive input terminal of the second comparator is electrically connected to the drain of the N-type reference transistor and the output terminals of the first comparator and the second comparator are electrically connected to the input of the logic gate, wherein when the voltage level at the node connected between the P-type transistor and the N-type transistor is lower than the drain voltage of the N-type reference transistor or higher than the drain voltage of the P-type reference transistor, a high-level voltage at the output terminals of the comparators is outputted to the two input terminals of the logic gate, the logic gate outputs a high-level voltage to the input control unit to ensure that the bridged output stage is normally operated, wherein when the voltage level at the node connected between the P-type transistor and the N-type transistor in the bridged output stage is higher than the drain voltage of the N-type reference transistor or lower than the drain voltage of the P-type reference transistor, the output terminal of one of the comparators outputs a low-level voltage to the logic gate to control the input control unit to turn off all the transistors in the bridged output stage.

* * * * *